(12) United States Patent
Scheller et al.

(10) Patent No.: US 8,058,864 B2
(45) Date of Patent: Nov. 15, 2011

(54) CIRCUITS AND METHODS FOR PROVIDING A MAGNETIC FIELD SENSOR WITH AN ADAPTABLE THRESHOLD

(75) Inventors: P. Karl Scheller, Bow, NH (US); Andreas P. Friedrich, Metz-Tessy (DE); William P. Taylor, Amherst, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 200 days.

(21) Appl. No.: 12/425,528

(22) Filed: Apr. 17, 2009

(65) Prior Publication Data
US 2010/0264909 A1 Oct. 21, 2010

(51) Int. Cl.
*G01R 33/02* (2006.01)

(52) U.S. Cl. ............ 324/200; 324/207.25; 324/331

(58) Field of Classification Search .......... 324/331
See application file for complete search history.

(56) References Cited

U.S. PATENT DOCUMENTS

| | | | |
|---|---|---|---|
| 3,697,870 A * | 10/1972 | Brenner | 324/244 |
| 4,405,896 A * | 9/1983 | Akita | 324/207.18 |
| 5,339,067 A * | 8/1994 | Harris et al. | 338/323 |
| 5,442,283 A | 8/1995 | Vig et al. | |
| 5,497,084 A * | 3/1996 | Bicking | 324/207.25 |
| 5,510,706 A * | 4/1996 | Good | 324/166 |
| 5,554,948 A * | 9/1996 | Hansen et al. | 327/181 |
| 5,650,719 A | 7/1997 | Moody et al. | |
| 5,670,886 A * | 9/1997 | Wolff et al. | 324/644 |
| 5,729,130 A | 3/1998 | Moody et al. | |
| 5,917,320 A | 6/1999 | Scheller et al. | |
| 6,091,239 A | 7/2000 | Vig et al. | |
| 6,100,680 A | 8/2000 | Vig et al. | |
| 6,242,908 B1 | 6/2001 | Scheller et al. | |
| 6,289,072 B1 * | 9/2001 | Hubbard et al. | 377/20 |
| 6,356,741 B1 | 3/2002 | Bilotti et al. | |
| 6,404,188 B1 * | 6/2002 | Ricks | 324/207.22 |
| 6,525,531 B2 | 2/2003 | Forrest et al. | |
| 6,693,419 B2 | 2/2004 | Stauth et al. | |
| 6,853,178 B2 | 2/2005 | Hayat-Dawoodi | |
| 6,919,720 B2 | 7/2005 | Vig et al. | |
| 7,199,579 B2 | 4/2007 | Scheller et al. | |
| 7,362,094 B2 | 4/2008 | Voisine et al. | |
| 7,956,598 B2 * | 6/2011 | Ariyama | 323/313 |
| 2006/0119348 A1 | 6/2006 | Blossfeld | |

(Continued)

FOREIGN PATENT DOCUMENTS

WO  WO 03/067269 A2  8/2003

OTHER PUBLICATIONS

National Semiconductor, ADC0852/ADC0854 Multiplexed Comparator with 8-bit Reference Divider, Apr. 1995, pp. 9-10.*

(Continued)

*Primary Examiner* — Patrick Assouad
*Assistant Examiner* — Vincent P Spinella Mamo
(74) *Attorney, Agent, or Firm* — Daly, Crowley, Mofford & Durkee, LLP

(57) ABSTRACT

A magnetic field has a threshold that adapts in relation to a magnitude of a magnetic field signal representative of a movement of an object. A corresponding method adapts a threshold in relation to a magnitude of a magnetic field signal representative of a movement of an object.

25 Claims, 10 Drawing Sheets

U.S. PATENT DOCUMENTS

2009/0001972 A1* 1/2009 Fernandez et al. ....... 324/207.26

OTHER PUBLICATIONS

Notification of Transmittal of the International Search report and the Written Opinion of the International Searching authority; PCT/US2010/020602, dated Mar. 26, 2010, 11 pages.

Datasheet, Allegro Microsystems, Inc., "ATS637LSA, True Power On, Self-Calibrating, Zero Speed Gear Tooth Sensor System," Aug. 2001, 13 pages.

Datasheet, Allegro Microsystems, Inc., "ATS633LSB True Power On, Self-Calibrating, Zero Speed Gear Tooth Sensor System," 2001, 2003, 15 pages.

Scheller et al.: "Magnetic Field Detector Having a Variable Threshold;" U.S. Appl. No. 12/401,096, filed Mar. 10, 2009.

Scheller et al.: "Magnetic Field Detector Having a Variable Thresold;" U.S. Appl. No. 12/401,096, filed Mar. 10, 2009.

* cited by examiner

CIRCUITS AND METHODS FOR PROVIDING A MAGNETIC FIELD SENSOR WITH AN ADAPTABLE THRESHOLD

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to integrated circuits and, more particularly, to integrated circuits for detecting movement or rotation of a magnetic or a ferromagnetic object.

BACKGROUND OF THE INVENTION

Magnetic field sensors (e.g., proximity detectors or rotation detectors) for detecting ferromagnetic articles and/or magnetic articles are known. The magnetic field associated with the ferromagnetic article or magnet is detected by a magnetic field sensing element, such as a Hall element or a magnetoresistance element, which provides a signal (i.e., a magnetic field signal) proportional to a detected magnetic field. In some arrangements, the magnetic field signal is an electrical signal.

The magnetic field sensor processes the magnetic field signal to generate an output signal that changes state each time the magnetic field signal either reaches a peak (positive or negative peak) or crosses a threshold level. Therefore, the output signal, which has an edge rate or period, is indicative of a speed of rotation of the ferromagnetic gear or of the ring magnet.

One application for a magnetic field sensor is to detect the approach and retreat of each tooth of a rotating ferromagnetic or soft ferromagnetic gear. In some arrangements, a ring magnet having magnetic regions (permanent or hard magnetic material) with alternating polarity is coupled to the ferromagnetic gear or is used by itself and the magnetic field sensor is responsive to approach and retreat of the magnetic regions of the ring magnet.

In one type of magnetic field sensor, sometimes referred to as a peak-to-peak percentage detector (or threshold detector), a threshold level is equal to a percentage of the peak-to-peak magnetic field signal. One such peak-to-peak percentage detector is described in U.S. Pat. No. 5,917,320 entitled "Detection of Passing Magnetic Articles While Periodically Adapting Detection Threshold" and assigned to the assignee of the present invention.

Another type of magnetic field sensor, sometimes referred to as a slope-activated detector or as a peak-referenced detector, is described in U.S. Pat. No. 6,091,239 entitled "Detection Of Passing Magnetic Articles With a Peak Referenced Threshold Detector," which is assigned to the assignee of the present invention. In the peak-referenced magnetic field sensor, the threshold signal differs from the positive and negative peaks (i.e., the peaks and valleys) of the magnetic field signal by a predetermined amount. Thus, in this type of magnetic field sensor, the output signal changes state when the magnetic field signal comes away from a peak or valley by the predetermined amount.

It should be understood that, because the above-described peak-to-peak percentage detector and the above-described peak-referenced detector both have circuitry that can identify the positive and negative peaks of a magnetic field signal, the peak-to-peak percentage detector and the peak-referenced detector both include a peak detector portion adapted to detect positive peaks and negative peaks of the magnetic field signal. Each, however, uses the detected peaks in different ways.

In order to accurately detect the positive and negative peaks of a magnetic field signal, the proximity detector is capable of tracking at least part of the magnetic field signal. To this end, typically, one or more digital-to-analog converters (DACs) can be used to generate a tracking signal, which tracks the magnetic field signal. For example, in the above-referenced U.S. Pat. Nos. 5,917,320 and 6,091,239, two DACs are used, one (PDAC) to detect the positive peaks of the magnetic field signal and the other (NDAC) to detect the negative peaks of the magnetic field signal.

Some types of magnetic field sensors perform one or more types of calibration, typically at a time near to start up or power up of the magnetic field sensor. During one type of calibration, the above-described threshold level is determined.

The above-described types of magnetic field sensors (e.g., proximity detectors and rotation detectors) generate output signals having state transitions at times when the magnetic field signal crosses the threshold determined by the peak detector portion. Detection accuracy can be adversely affected by variations in the magnetic field signal that are attributable to factors other than the passing magnetic article. One source of such magnetic field variations is the spacing (or air gap) between the magnetic article and the magnetic field transducer. Air gap is inversely proportional to the peak-to-peak level of the magnetic field signal, so in small air gap arrangements, the magnetic field signal has a larger peak-to-peak signal level than in larger air gap arrangements.

It can be challenging to choose a threshold signal level that is suitable for both small and large air gap installations. In particular, for larger air gaps, it is desirable for the threshold signal to be at one level to ensure that the comparator output signal switches as desired, whereas, for smaller air gaps, a different threshold signal level is desirable.

Since the above-described types of magnetic field sensors have peak detector portions that accurately position the threshold in accordance with the magnitude of the magnetic field signal, these types of magnetic field sensors tend to have output signals with good edge timing accuracy relative to cycles of the magnetic field signal and for different amplitude magnetic field signals. They also tend to provide a high quality output signal relatively quickly after start tip, e.g., when power is first applied, or when the detected object first starts moving.

The above-described magnetic field sensors having peak detector portions are relatively complex. Simpler magnetic field sensors merely use a fixed threshold with no peak detector portion, and compare the magnetic field signal to the fixed threshold. An output signal is generated having state transitions at times when the magnetic field signal crosses the fixed threshold. This type of magnetic field sensor is low cost, but suffers from having an output signal with less edge timing accuracy and poor start up behavior, e.g., when power is first applied, or when the detected object first starts moving (which may result in a temporary change of air gap). This type of magnetic field sensor also may not be accurate for changes in air gap (e.g., such as may occur as a result in asymmetries of the moving object) or for different initial air gaps between the magnetic field sensing element and a sensed object.

In certain peak-referenced magnetic field sensors, the threshold offset amount is selected at startup in response to a measurement of the peak magnetic field signal level and is fixed for circuit operation thereafter. If the peak magnetic field signal level is greater than a predetermined amount, then a small air gap is presumed and a relatively large threshold offset amount is used. Alternatively, if the peak magnetic field signal level is less than the predetermined amount, then a large air gap is presumed and a smaller threshold offset amount is used.

It would, therefore, be desirable to provide a magnetic field sensor, in particular, a proximity detector or rotation detector, that is simpler, and therefore, less expensive, than the above-described magnetic field sensors that have peak detector portions, yet which has better edge timing accuracy and better start up behavior than the above-described simple magnetic field sensor that uses a fixed threshold, and further that adapts to changes in the magnetic field signal that may occur due to changes in air gap during operation or that may occur in different installations.

SUMMARY OF THE INVENTION

The present invention provides a magnetic field sensor, in particular, a magnetic field sensor, that is simpler, and therefore, less expensive, than magnetic field sensors that have peak detector portions, yet which has better edge timing accuracy and better start up behavior than a simple magnetic field sensor that uses a fixed threshold, and further that adapts to changes in the magnetic field signal that may occur due to changes in air gap during operation or that may occur in different installations.

In accordance with one aspect of the present invention, a magnetic field sensor includes a magnetic field sensing element configured to provide a magnetic field signal representative of a magnetic field experienced by the magnetic field sensing element. The magnetic field sensor also includes a first threshold generating circuit configured to generate a first plurality of different threshold signals. The magnetic field sensor also includes at least one comparator coupled to receive a respective at least one of the first plurality of different threshold signals at a first input node and coupled to receive the magnetic field signal at a second input node. The at least one comparator is configured to generate a plurality of comparison signals indicative of the magnetic field signal having an amplitude above or below respective ones of the first plurality of different threshold signals. A sensor output signal is generated by the magnetic field sensor based on the plurality of comparison signals.

In accordance with another aspect of the present invention, a method of providing a magnetic field sensor having a sensor output signal indicative of a movement of an object includes generating a magnetic field signal with a magnetic field sensing element. The magnetic field signal is representative of a changing magnetic field resulting from the movement of the object. The method also includes generating a first plurality of different threshold signals and comparing the magnetic field signal to the first plurality of different threshold signals to provide a corresponding plurality of comparison signals. The method also includes generating the sensor output signal from the magnetic field sensor based on the plurality of comparison signals.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained. As used herein, the term "magnetic field sensing element" is used to describe a variety of types of electronic elements that can sense a magnetic field. The magnetic field sensing elements can be, but are not limited to, Hall effect elements, magnetoresistance elements, or magnetotransistors. As is known, there are different types of Hall effect elements, for example, planar Hall elements, vertical Hall elements, circular Hall elements, and Indium antimonide (InSb) sensors. As is also known, there are different types of magnetoresistance elements, for example, anisotropic magnetoresistance (AMR) elements, giant magnetoresistance (GMR) elements, tunneling magnetoresistance (TMR) elements, and magnetic tunnel junction (MTJ) elements.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, most, but not all, types of magnetoresistance elements tend to have axes of maximum sensitivity parallel to the substrate and most, but not all, types of Hall elements tend to have axes of sensitivity perpendicular to a substrate.

As used herein, the term "magnetic field sensor" is used to describe a circuit that includes a magnetic field sensing element. Magnetic field sensors are used in a variety of applications, including, but not limited to, a current sensor that senses a magnetic field generated by a current carried by a current-carrying conductor, a magnetic switch that senses the proximity of a ferromagnetic object, a rotation detector (also referred to herein as a proximity detector) that senses passing ferromagnetic articles, for example, gear teeth, and a magnetic field sensor that senses a magnetic field density of a magnetic field. Rotation detectors are used as examples herein. However, the circuits and techniques described herein apply also to any magnetic field sensor capable of detecting a motion of an object.

As used herein, the term "peak detector" is used to describe a circuit that can hold a signal representative of a positive peak or a negative peak (or both) of a magnetic field signal. It should be understood that both a peak-referenced detector and a peak-to-peak percentage detector employ a peak detector circuit of some sort.

Figure 1:
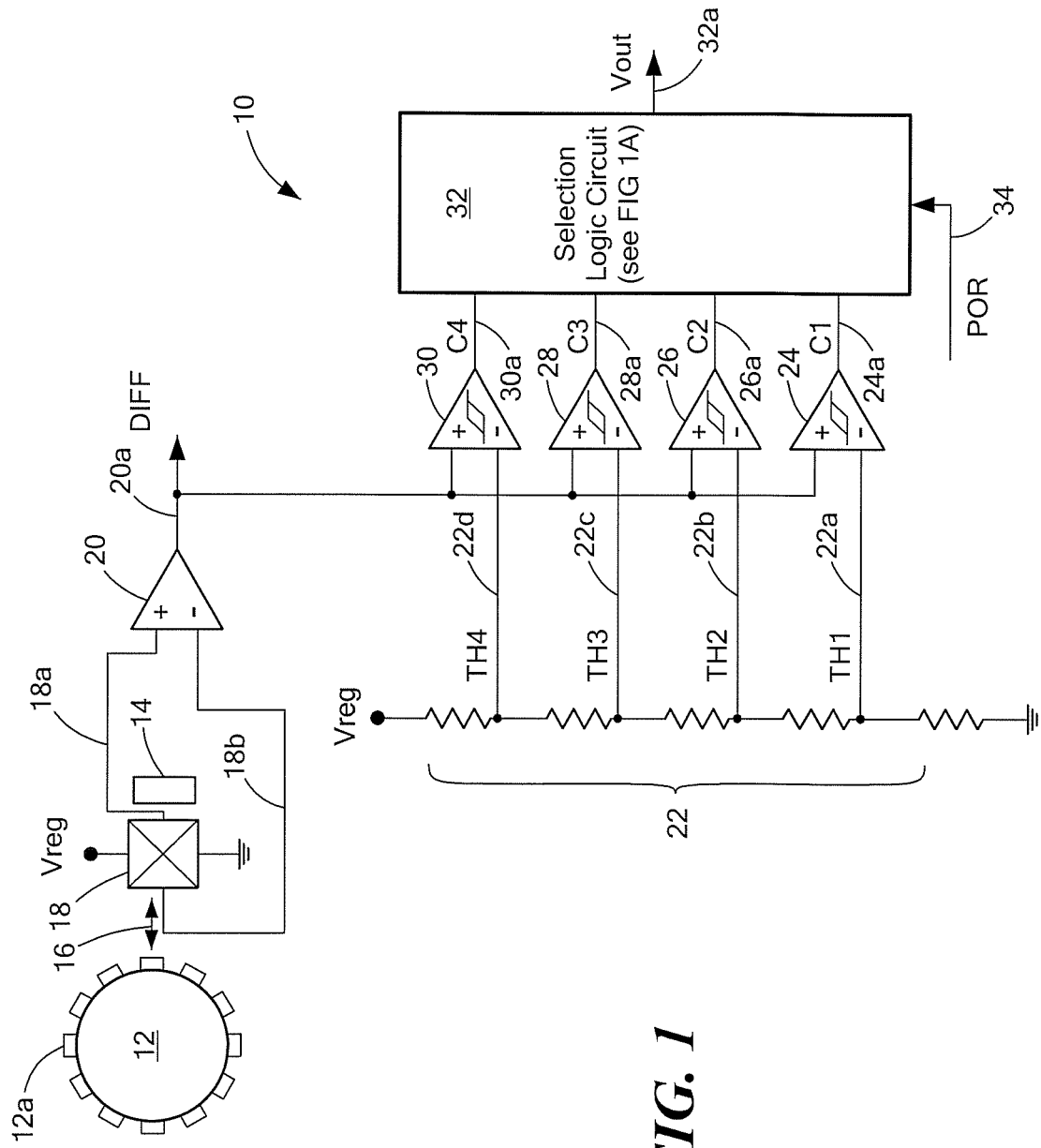
FIG. 1 is block diagram showing an exemplary magnetic field sensor in the form of rotation sensor that generates a plurality of comparison signals and that processes the plurality of comparison signals with a selection logic circuit to provide a sensor output signal.

Referring now to FIG. 1, an exemplary magnetic field sensor 10 includes a magnetic field sensing element 18 for generating an output signal 18a, 18b in response to movement of an object 12. The magnetic field sensing element 18 can be, but is not limited to, a Hall effect element, a magnetoresistance element, or a magnetotransistor. An air gap 16 is between the object 12 and the magnetic field sensing element 18.

The object 12 can be an object adapted to rotate, for example, a ferromagnetic gear. The magnetic field sensor 10 can include an amplifier 20 coupled to receive the signals 18a, 18b from the magnetic field sensing element 18 and configured to generate a DIFF signal 20a, also referred to herein as a magnetic field signal 20a. In some embodiments, the amplifier 20 can be and automatic gain amplifier, and in other embodiments, the amplifier 20 can be a fixed gain amplifier.

The magnetic field sensing element 18 is responsive to the motion of the object 12, for example, motion of gear teeth upon a gear, of which a gear tooth 12a upon the gear 12 is representative. In some arrangements, the magnetic field sensor 10 can include a hard ferromagnetic element 14, such as a permanent magnet 14, positioned on an opposite side of the magnetic field sensing element 18 from the object 12, in a back-bias configuration. In this arrangement, the object 12 can be comprised of a soft ferromagnetic material and may be ferrous or non-ferrous. The magnet 14 can generate a magnetic field perturbed by the gear teeth as they rotate, which perturbance is sensed by the magnetic field sensing element 18. Thus, the magnetic field sensing element 18 is responsive to proximity of the gear teeth, e.g., 12a.

However, in other arrangements, the object 12 can have hard magnetic regions, in which case, magnetic field sensing element 12 can be responsive to movement of magnetic regions upon a magnet, for example, a ring magnet coupled to the object 12, and having segmented magnetic regions.

The magnetic field sensor 10 can also include a threshold signal generating circuit, here a voltage generating circuit 22 configured to generate a plurality of different threshold signals 22a-22d, here a plurality of different voltages 22a-22d. The magnetic field sensor 10 can also include a plurality of comparators 24, 26, 28, 30. Each one of the plurality of comparators 24, 26, 28, 30 is coupled to receive a respective one of the plurality of different voltages 22a-22d at a respective first input node, and each one of the plurality of comparators 24, 26, 28, 30 is coupled to receive the magnetic field signal 20a at a respective second input node. The plurality of comparators 24, 26, 28, 30 is configured to generate a corresponding plurality of comparison signals 24a, 26a, 28a, 30a indicative of the magnetic field signal 20a having an amplitude above or below respective ones of the plurality of different voltages. A sensor output signal 32a is generated by the magnetic field sensor 10 based on the plurality of comparison signals 24a, 26a, 28a, 30a.

In some arrangements, the voltages 22a-22d are linearly spaced. In other embodiments, the voltages 22a-22d are non-linearly spaced, for example, logarithmically spaced.

The magnetic field sensor 10 can include a selection logic circuit 32 coupled to receive the plurality of comparison signals 24a, 26a, 28a, 30a, configured to adaptively select one of the plurality of comparison signals 24a, 26a, 28a, 30a, and configured to provide the selected one of the plurality of comparison signals 24a, 26a, 28a, 30a as the sensor output signal 32a.

The selection logic circuit 32 can also be coupled to receive a power on reset (POR) signal 34 that initializes the elements of the selection logic circuit 32 to a known state after power is applied to the selection logic circuit 32. The POR signal 34 can be generated by other circuits (not shown) that will be understood.

Operation of the selection logic circuit 32 is described in greater detail below in conjunction with FIGS. 1A, 1B, 2, and 2A.

Figures 1A, 1B:
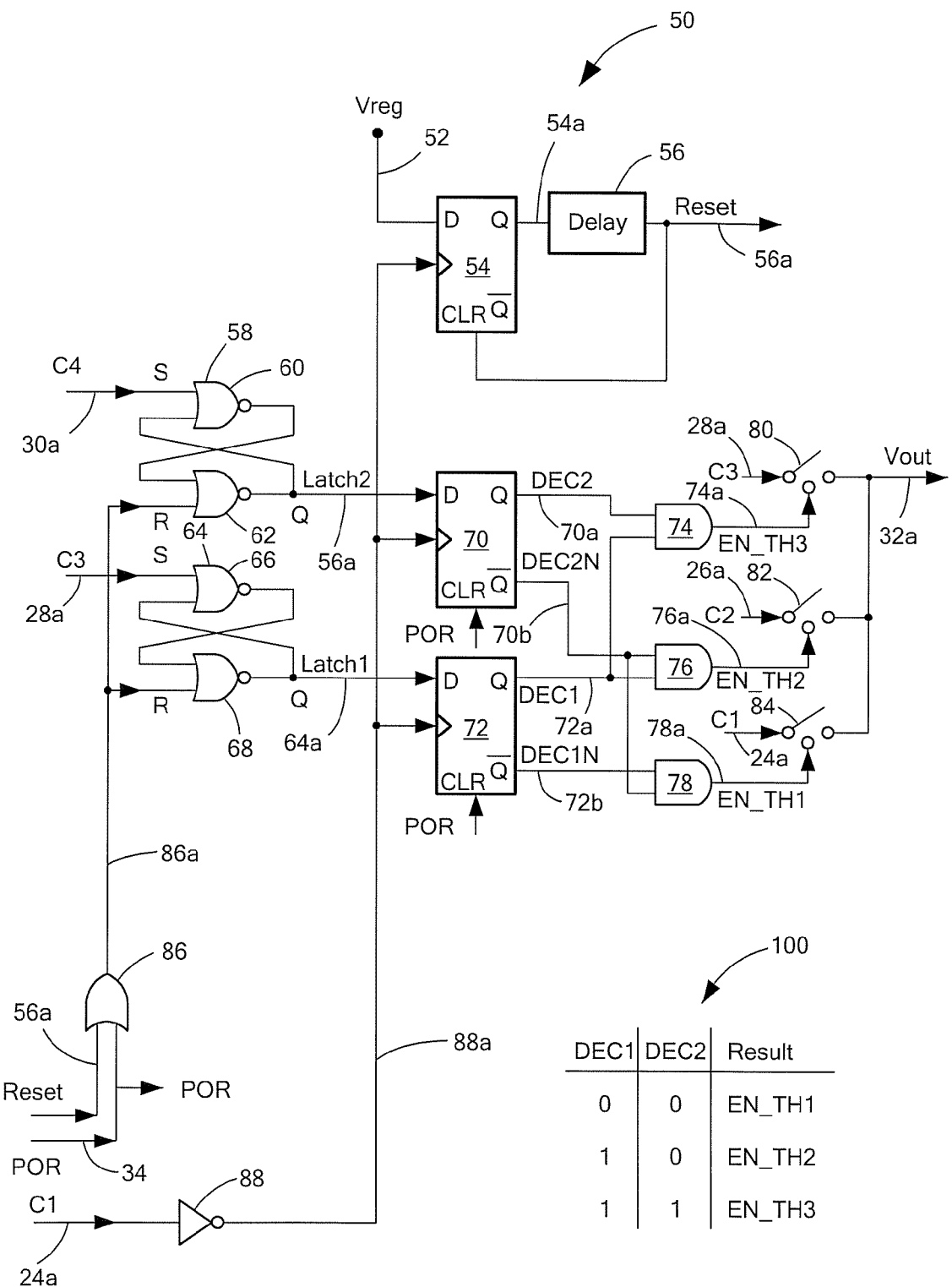
FIG. 1A is a block diagram showing further details of an exemplary selection logic circuit that can be used as the selection logic circuit of FIG. 1.
FIG. 1B is a logic chart describing some of the signal logic of the selection logic circuit of FIG. 1A.

Referring now to FIG. 1A, in which like elements of FIG. 1 are shown having like reference designations, a selection logic circuit 50 can be the same as or similar to the selection logic circuit 32 of FIG. 1. The selection logic circuit 50 can include a first latch 64 comprised of gates 66, 68 coupled in a known latch arrangement and a second latch 58 comprised of gates 60, 62 similarly coupled in the known latch arrangement. The first latch 64 is couple to receive the comparison signal 28a of FIG. 1 and the second latch 58 is coupled to receive the comparison signal 30a of FIG. 1. The first latch 64 is configured to generate a latched signal 64a and the second latch 58 is configured to generate a latched signal 58a.

The selection logic circuit 50 can also include a logic gate 86, here an OR gate 86, coupled to receive a reset signal 56a and also coupled to receive the POR signal 34 of FIG. 1. The gate 86 is configured to generate a signal 86a coupled to a respective reset input of the first and second latches 64, 58, respectively.

The selection logic circuit 50 can also include a logic gate 88, here an inverter 88, coupled to receive the comparison signal 24a of FIG. 1 and configured to generate a signal 88a.

The selection logic circuit 50 can include a first D-type flip-flop 72 coupled to receive the latched signal 64a at a respective D input and a second D-type flip-flop 70 coupled to receive the latched signal 58a at a respective D input. The first and second flip-flops 72, 70, respectively, are coupled to receive the signal 88a at respective clock inputs and the POR signal 34 at respective clear (CLR) inputs.

The first flip-flop 72 is configured to generate a respective output signal 72a and a respective inverted output signal 72b. The second flip-flop 70 is configured to generate a respective output signal 70a and a respective inverted output signal 70b.

The selection logic circuit 50 can include a logic gate 74, here a two input AND gate 74, coupled to receive the signals 70a, 72a, and configured to generate an output signal 74a. The selection logic circuit 50 can further include a logic gate 76, here a two input AND gate 76, coupled to receive the signals 70b, 72a, and configured to generate an output signal 76a. The selection logic circuit 50 can further include a logic gate 78, here a two input AND gate 78, coupled to receive the signals 70b, 72b, and configured to generate an output signal 78a.

The selection logic circuit 50 can include a switch 84 coupled to receive the signal 78a at a respective control node and coupled to receive the comparison signal 24a of FIG. 1 at a respective input node. The selection logic circuit 50 can further include a switch 82 coupled to receive the signal 76a at a respective control node and coupled to receive the comparison signal 26a of FIG. 1 at a respective input node. The selection logic circuit 50 can further include a switch 80 coupled to receive the signal 74a at a respective control node and coupled to receive the comparison signal 28a of FIG. 1 at a respective input node. Output nodes of the switches 80-84 can be coupled together at a junction node where the sensor output signal 32a of FIG. 1 is generated.

The selection logic circuit 50 can include another D-type flip-flop 54 coupled to receive a high state DC voltage 52, for example, a regulated voltage 52, at a respective D input and coupled to receive the signal 88a at a respective clock node. The flip-flop 54 is configured to generate an output signal 54a. A delay circuit 56, for example, a combination of logic gates, can be coupled to receive the signal 54a and configured to generate the reset signal 56a coupled to a respective clear node (CLR) of the flip-flop 54.

Operation of the selection logic circuit 50 is further described below. However, let it suffice here to say that the selection logic circuit 50 is configured to select, by way of the switches 84, 82, 80, one of the comparison signals 24a, 26a, 28a as the sensor output signal 32a.

Referring now to FIG. 1B, it will be apparent that one of the control signals 78a, 76a, 74a is active at any time, depending upon states of the output signals 72a, 70a of the flip flops 72, 70.

Figure 2:
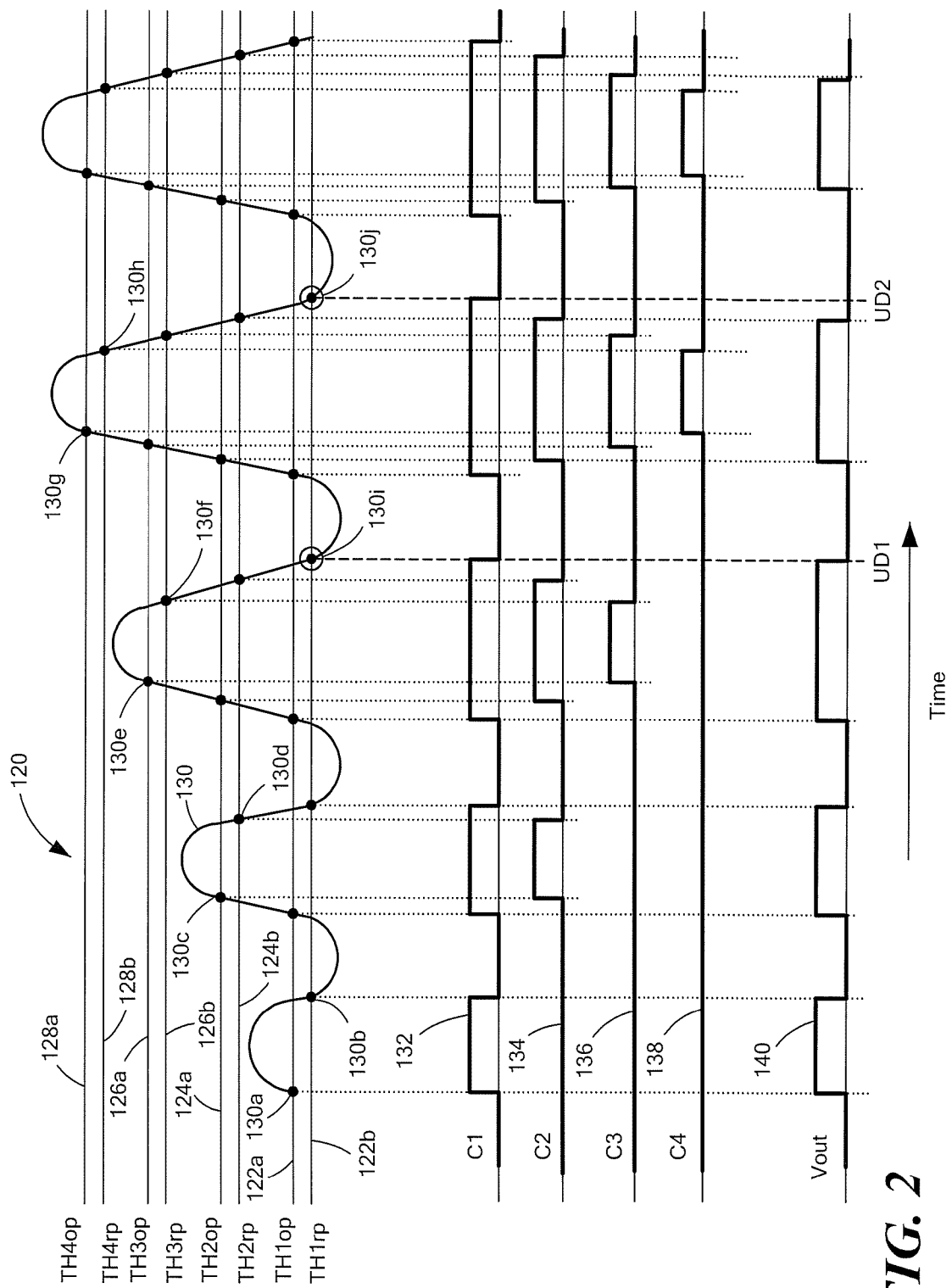
FIG. 2 is a graph showing a magnetic field signal, four comparison signals, and a sensor output signal representative of operation of the magnetic field sensor of FIG. 1.

Referring now to FIG. 2, a graph 120 has a horizontal axis in arbitrary units of time and a vertical axis in arbitrary units of voltage. Thresholds 122a, 122b correspond to the voltage 22a of FIG. 1 modified by hysteresis associated with the comparator 24 of FIG. 1 so as to be divided into the two thresholds 122a, 122b, which are referred to herein as an operating point threshold (TH1*op*) 122a and a release point threshold (TH1*rp*) 122b. Thresholds 124a, 124b correspond to the voltage 22b of FIG. 1 modified by hysteresis associated with the comparator 26 of FIG. 1 so as to be divided into the two thresholds 124a, 124b. Thresholds 126a, 126b correspond to the voltage 22c of FIG. 1 modified by hysteresis associated with the comparator 28 of FIG. 1 so as to be divided into the two thresholds 126a, 126b. Thresholds 128a, 128b correspond to the voltage 22d of FIG. 1 modified by hysteresis associated with the comparator 30 of FIG. 1 so as to be divided into the two thresholds 128a, 128b.

A signal 130 is representative of changes of amplitude of the magnetic field signal 20a of FIG. 1, for example, during a start up of the magnetic field sensor 10 of FIG. 1, during a beginning of a rotation of the object 12 of FIG. 1 (e.g., which may result in a temporary change of air gap), upon changes of the air gap 16 between to object 12 and the magnetic field sensing element 18 of FIG. 1, or in different installations of the magnetic field sensor 10 of FIG. 1 having different initial air gap. It will be appreciated that, particularly for an arrangement having the magnet 14 of FIG. 1, the magnetic field signal 130 (20a of FIG. 1) tends to maintain its negative peak at approximately the same voltage, and it is the positive peak that increases as shown. It will also be recognized that changes in air gap can result from asymmetries associated with the object, e.g., the gear 12 of FIG. 1, resulting in changes of the air gap 16 of FIG. 1 depending upon rotational angle of the gear 12.

Points 130a, 130b are representative of times when the magnetic field signal 130 crosses the operating point threshold 122a and the release point threshold 122b, resulting in corresponding changes of state of the comparison signal 24a of FIG. 1. Points 130c, 130d are representative of times when the magnetic field signal 130 crosses the operating point threshold 124a and the release point threshold 124b, resulting in corresponding changes of state of the comparison signal 26a of FIG. 1. Points 130e, 130f are representative of times when the magnetic field signal 130 crosses the operating point threshold 126a and the release point threshold 126b, resulting in corresponding changes of state of the comparison signal 28a of FIG. 1. Points 130g, 130h are representative of times when the magnetic field signal 130 crosses the operating point threshold 128a and the release point threshold 128b, resulting in corresponding changes of state of the comparison signal 30a of FIG. 1.

Point 130i is representative of a time when the magnetic field signal 130 has first crossed the operating point 130e and thereafter crosses the release point threshold 122b, which as described above, is a point at which an update occurs to select a different one of the comparison signals as the sensor output signal 32a of FIG. 1. Point 130j is representative of a time when the magnetic field signal 130 has first crossed the operating point threshold 130g and thereafter crosses the release point threshold 122b, which is another point at which an update occurs to select a different one of the comparison signals as the sensor output signal 32a of FIG. 1.

A signal 132 is representative of the comparison signal 24a of FIG. 1, having changes of state corresponding to times when the magnetic field signal 130 crosses the operating point threshold 122a and the release point threshold 122b. A signal 134 is representative of the comparison signal 26a of FIG. 1, having changes of state corresponding to times when the magnetic field signal 130 crosses the operating point threshold 124a and the release point threshold 124b. A signal 136 is representative of the comparison signal 28a of FIG. 1 having changes of state corresponding to times when the magnetic field signal 130 crosses the operating point threshold 126a and the release point threshold 126b. A signal 138 is representative of the comparison signal 30a of FIG. 1 having changes of state corresponding to times when the magnetic field signal 130 crosses the operating point threshold 128a and the release point threshold 128b.

A signal 140 is representative of the sensor output signal 32a of FIGS. 1 and 1A. It will be understood that, until a time UD1 (where UD refers to "update"), the sensor output signal 140 is the same as the comparison signal 132. Between times UD1 and UD2, the sensor output signal is the same as the comparison signal 134. In other words, the selection logic circuit 50 of FIG. 1A has changed from a selection of the comparison signal 24a to a selection of the signal 26a. After the time UD2, the sensor output signal 140 is the same as the comparison signal 136. In other words, the selection logic circuit 50 of FIG. 1A has changed from a selection of the comparison signal 26a to a selection of the comparison signal 28a.

From the discussion above, it will be apparent that the effective operating point and release point thresholds against which the magnetic field signal 130 is compared to achieve the sensor output signal 140 are thresholds 122a, 122b until the time UD1, thresholds 124a, 124b between the times UD1 and UD2, and thresholds 126a, 126b after the time UD2. Therefore, the effective threshold remains more centered in the amplitude range of the magnetic field signal 130 as the magnetic field signal 130 changes amplitude than would be achieved by an arrangement having only one fixed threshold. This results in better edge timing accuracy in the sensor output signal 140, and less likelihood of missed edges.

Figure 2A:
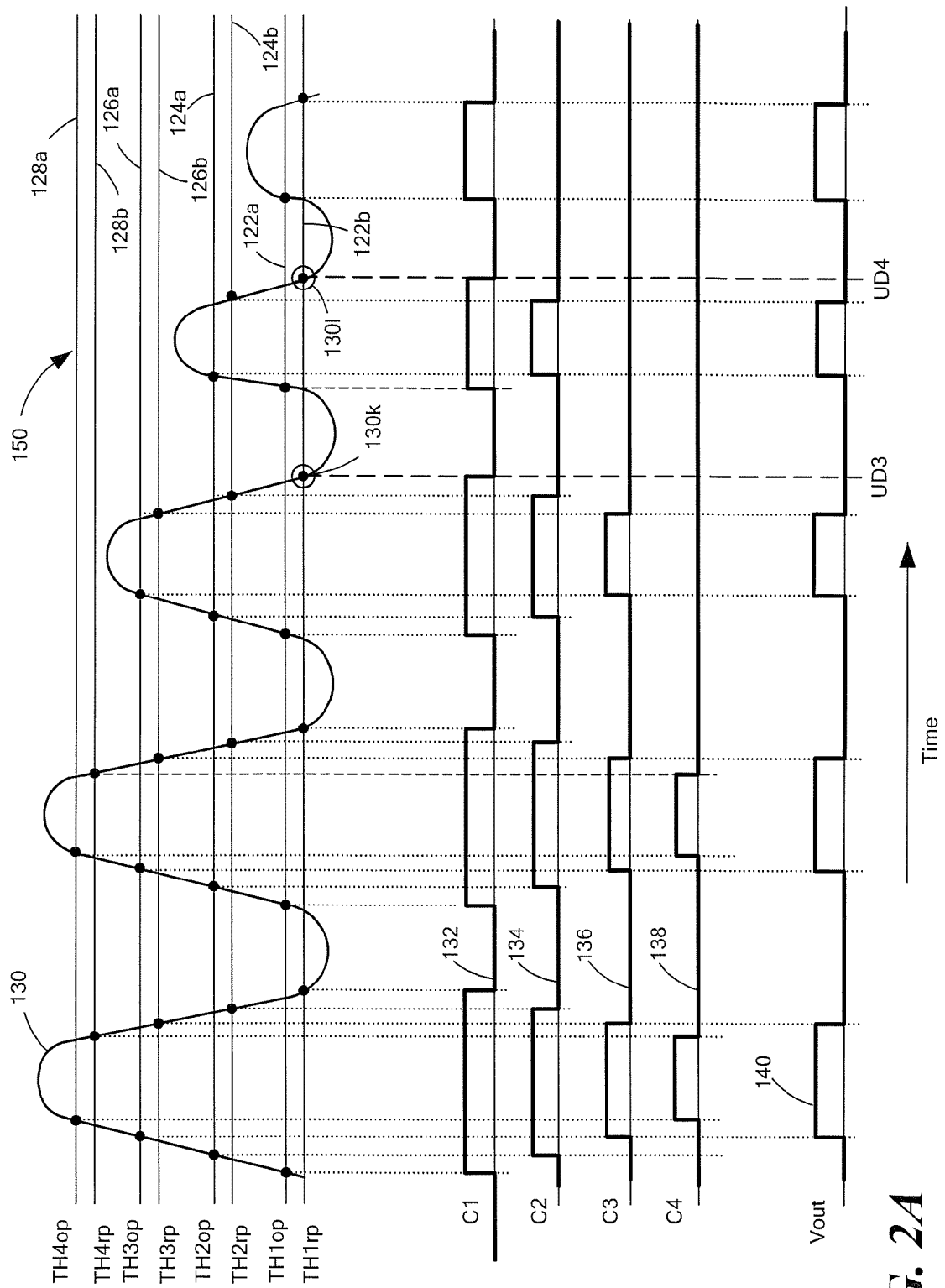
FIG. 2A is a graph showing a magnetic field signal, four comparison signals, and a sensor output signal representative of further operation of the magnetic field sensor of FIG. 1.

Referring now to FIG. 2A, in which like elements of FIG. 2 are shown having like reference designations, a graph 150 has a horizontal axis in arbitrary units of time and a vertical axis in arbitrary units of voltage. Unlike the graph 120 of FIG. 2, the signal 130 is shown decreasing in amplitude, such as may occur when the object 12 of FIG. 1 slows to a stop (e.g., which may result in a temporary change of air gap), or when the air gap 16 increases or is larger. As described above, it will also be recognized that changes in air gap can result from asymmetries associated with the object, e.g., the gear 12 of FIG. 1, resulting in changes of the air gap 16 of FIG. 1 depending upon rotational angle of the gear 12.

As described in conjunction with FIG. 2, the signal 140 is representative of the sensor output signal 32a of FIGS. 1 and 1A. It will be understood that, until a time UD3, the sensor output signal 140 is the same as the comparison signal 136. Between times UD3 and UD4, the sensor output signal is the same as the comparison signal 134. In other words, the selection logic circuit 50 of FIG. 1A has changed from a selection of the signal comparison 28a to a selection of the signal 26a. After the time UD4, the sensor output signal is the same as the comparison signal 132. In other words, the selection logic circuit 50 of FIG. 1A has changed from a selection of the signal comparison 26a to a selection of the comparison signal 24a.

From the discussion above, it will be apparent that the effective operating point and release point thresholds against which the magnetic field signal 130 is compared to achieve the sensor output signal 140 are threshold 126a, 126b until the time UD3, thresholds 124a, 124b between the times UD3 and UD4, and thresholds 122a, 122b after the time UD4. Therefore, the effective threshold remains more centered in the amplitude range of the magnetic field signal 130 as the magnetic field signal 130 changes amplitude than would be achieved by an arrangement having only one fixed threshold. This results in better edge timing accuracy in the sensor output signal 140, and less likelihood of missed edges.

Figure 3:
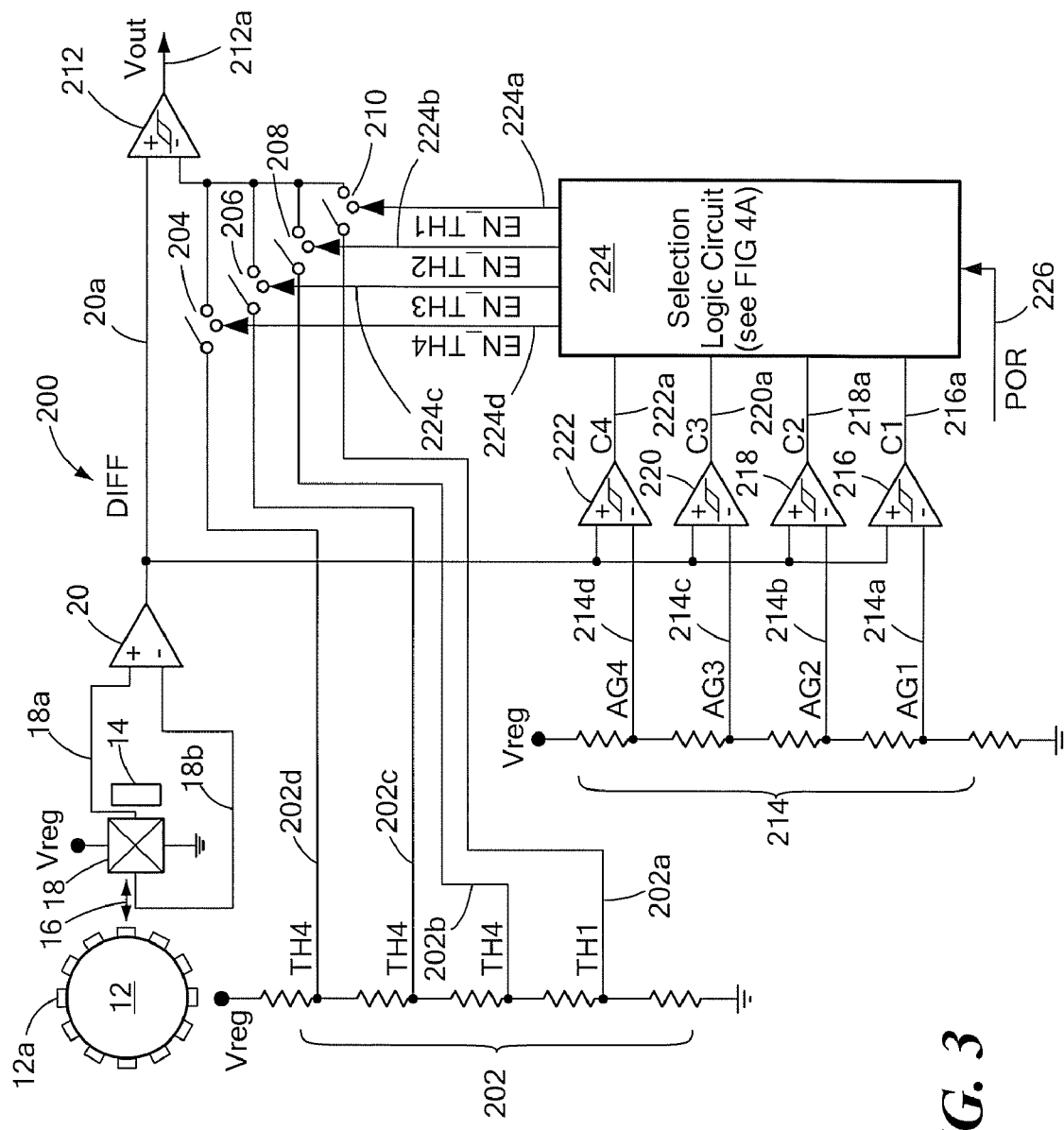
FIG. 3 is block diagram showing another exemplary magnetic field sensor in the form of rotation sensor that generates a plurality of comparison signals and that processes the plurality of comparison signals with a selection logic circuit to provide a sensor output signal.

Referring now to FIG. 3, in which like elements of FIG. 1 are shown having like reference designations, another exemplary magnetic field sensor 200 includes the magnetic field sensing element 18 for generating the output signal 18a, 18b in response to movement of the object 12.

The object 12 can be an object adapted to rotate, for example, a ferromagnetic gear. The magnetic field sensor 200 can include the amplifier 20 coupled to receive the signals 18a, 18b from the magnetic field sensing element 18 and configured to generate the DIFF signal 20a, also referred to herein as a magnetic field signal.

The magnetic field sensor 200 can also include a first threshold signal generating circuit 214, here a first voltage generating circuit 214, configured to generate a first plurality of different threshold signals 214a-214d, here a first plurality of different voltages 214a-214d. The magnetic field sensor 200 can also include a plurality of comparators 216, 218, 220, 222. Each one of the plurality of comparators 216, 218, 220, 222 is coupled to receive a respective one of the first plurality of different voltages 214a-214d at a respective first input node, and each one of the plurality of comparators 216, 218, 220, 222 is coupled to receive the magnetic field signal 20a at a respective second input node. The plurality of comparators 216, 218, 220, 222 is configured to generate a corresponding plurality of comparison signals 216a, 218a, 220a, 222a indicative of the magnetic field signal 20a having an amplitude above or below respective ones of the first plurality of different voltages 214a-214d. A sensor output signal 212a is generated by the magnetic field sensor 200 based on the plurality of comparison signals 216a, 218a, 220a, 222a.

The magnetic field sensor 200 can include a selection logic circuit 224 coupled to receive the plurality of comparison signals 216a, 218a, 220a, 222a, configured to process the plurality of comparison signals 216a, 218a, 220a, 222a, and configured to generate a plurality of control signals 224a-224d.

The magnetic field sensor 200 can also include a second threshold generating circuit 202, here a second voltage generating circuit 202, configured to generate a second plurality of different threshold signals, here a second plurality of different voltages 202a-202d. The magnetic field sensor 200 can also include a plurality of switches 204, 206, 208, 210. Each one of the plurality of switches 204, 206, 208, 210 is coupled to receive a respective one of the second plurality of different voltages 202a-202d at a respective input node, and each one of the plurality of switches 204, 206, 208, 210 is coupled to receive a respective one of the plurality of control signals 224a-224d at a respective control node. Output nodes of the plurality of switches 204, 206, 208, 210 are coupled together at a junction node 228.

The magnetic field sensor 200 can also include an output comparator 212 having a first input node coupled to the junction node 228 of the plurality of switches 204, 206, 208, 210 and having a second input node coupled to receive the magnetic field signal 20a. The output comparator 212 is configured to generate the sensor output signal 212a.

In some arrangements, the first voltages 214a-214d are linearly spaced. In other embodiments, the first voltages 214a-214d are nonlinearly spaced, for example, logarithmically spaced. In some arrangements, the second voltages 202a-202d are linearly spaced. In other embodiments, the second voltages 202a-202d are nonlinearly spaced, for example, logarithmically spaced. In some embodiments, the second plurality of voltages 202a-202d is higher than the first plurality of voltages 214a-214d. In other embodiments, the first plurality of voltages 214a-214d is higher than the second plurality of voltages 202a-202d. In still other embodiments, the first and second pluralities of voltages 214a-214d, and 202a-202d, respectively, are interspersed.

The selection logic circuit 224 can also be coupled to receive a power on reset (POR) signal 226. The POR signal 226 can be generated by other circuits (not shown) that will be understood.

Operation of the selection logic circuit 224 is described in greater detail below in conjunction with FIGS. 3A, 3B, 4, and 4A.

Figures 3A, 3B:
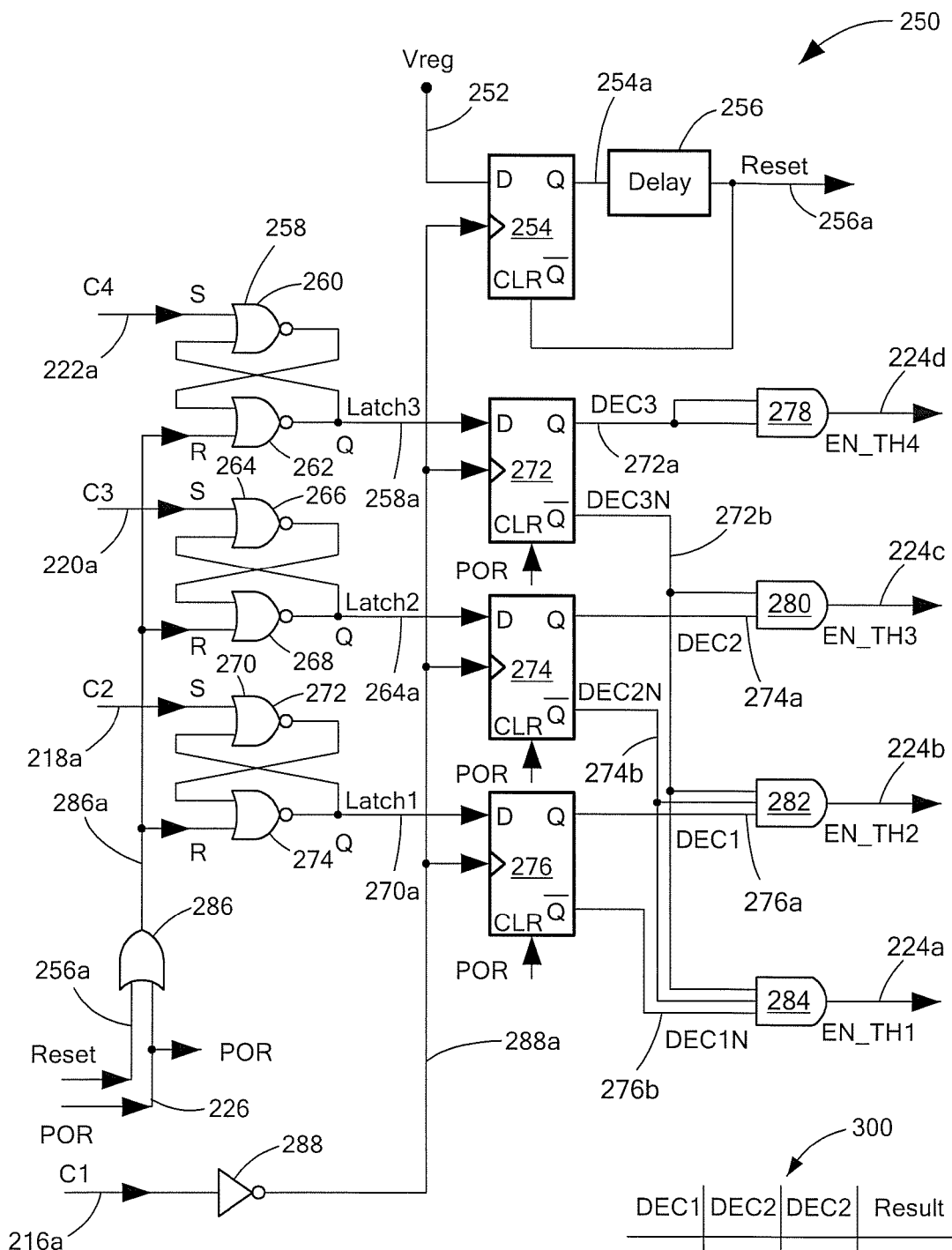
FIG. 3A is a block diagram showing further details of an exemplary selection logic circuit that can be used as the selection logic circuit of FIG. 3.
FIG. 3B is a logic chart describing some of the signal logic of the selection logic circuit of FIG. 3A.

Referring now to FIG. 3A, in which like elements of FIG. 3 are shown having like reference designations, a selection logic circuit 250 can be the same as or similar to the selection logic circuit 224 of FIG. 3. The selection logic circuit 250 can include a first latch 270 comprised of gates 272, 274 coupled in a known latch arrangement, a second latch 264 comprised of gates 266, 268 similarly coupled in the known latch arrangement, and a third latch 258 comprised of gates 260, 262 similarly coupled in the known latch arrangement. The first latch 270 is coupled to receive the comparison signal 218a of FIG. 3, the second latch 264 is coupled to receive the comparison signal 220a of FIG. 3, and the third latch 258 is coupled to receive the comparison signal 222a of FIG. 3. The first latch 270 is configured to generate a latched signal 270a, the second latch 264 is configured to generate a latched signal 264a, and the third latch 258 is configured to generate a latched signal 258a.

The selection logic circuit 250 can also include a logic gate 286, here an OR gate 286, coupled to receive a reset signal 256a and also coupled to receive the POR signal 226 of FIG. 3. The gate 286 is configured to generate a signal 286a coupled to a respective reset input of the first, second, and third latches 270, 264, 258, respectively.

The selection logic circuit 250 can also include a logic gate 288, here an inverter 288, coupled to receive the comparison signal 216a of FIG. 3 and configured to generate a signal 288a.

The selection logic circuit 250 can include a first D-type flip-flop 276 coupled to receive the latched signal 270a at a respective D input, a second D-type flip-flop 274 coupled to receive the latched signal 264a at a respective D input, and a third D-type flip-flop 272 coupled to receive the latched signal 258a at a respective D input. The first, second, and third flip-flops 276, 274, 272, respectively, are coupled to receive the signal 288a at respective clock inputs and the POR signal 226 at respective clear (CLR) inputs.

The first flip-flop 276 is configured to generate a respective output signal 276a and a respective inverted output signal 276b. The second flip-flop 274 is configured to generate a respective output signal 274a and a respective inverted output signal 274b. The third flip-flop 272 is configured to generate a respective output signal 272a and a respective inverted output signal 272b.

The selection logic circuit 250 can include a logic gate 284, here a three input AND gate 228, coupled to receive the signals 272b, 274b, 276b, and configured to generate the control signal 224a. The selection logic circuit 250 can further include a logic gate 282, here a three input AND gate 282, coupled to receive the signals 272b, 274b, 276a, and configured to generate the control signal 224b. The selection logic circuit 250 can further include a logic gate 280, here a two input AND gate 280, coupled to receive the signals 272b, 274a, and configured to generate the control signal 224c. The selection logic circuit 250 can further include a logic gate 278, here a two input AND gate 278, coupled to receive the signals 272a at both input nodes, and configured to generate the control signal 224d. The logic gate 278 is provided merely to present the same signal delay as the logic gates 280, 282, 284.

The selection logic circuit 250 can include another D-type flip-flop 254 coupled to receive a high state DC voltage 252, for example, a regulated voltage 252, at a respective D input and coupled to receive the signal 288a at a respective clock node. The flip-flop 254 is configured to generate an output signal 254a. A delay circuit 256, for example, a combination of logic gates, can be coupled to receive the signal 254a and configured to generate the reset signal 256a coupled to a respective clear node (CLR) of the flip-flop 254.

Operation of the selection logic circuit 250 is further described below. However, let it suffice here to say that the selection logic circuit 250 is configured to activate one of the control signals 224a-224d in response to the comparison signals 216a, 218a, 220a, 222a.

Referring now to FIG. 3B, it will be apparent that one of the control signals 216a, 218a, 220a, 222a is active at any time, depending upon states of the output signals 276a, 274a, 272a of the flip-flops 276, 274, 272.

Figure 4:
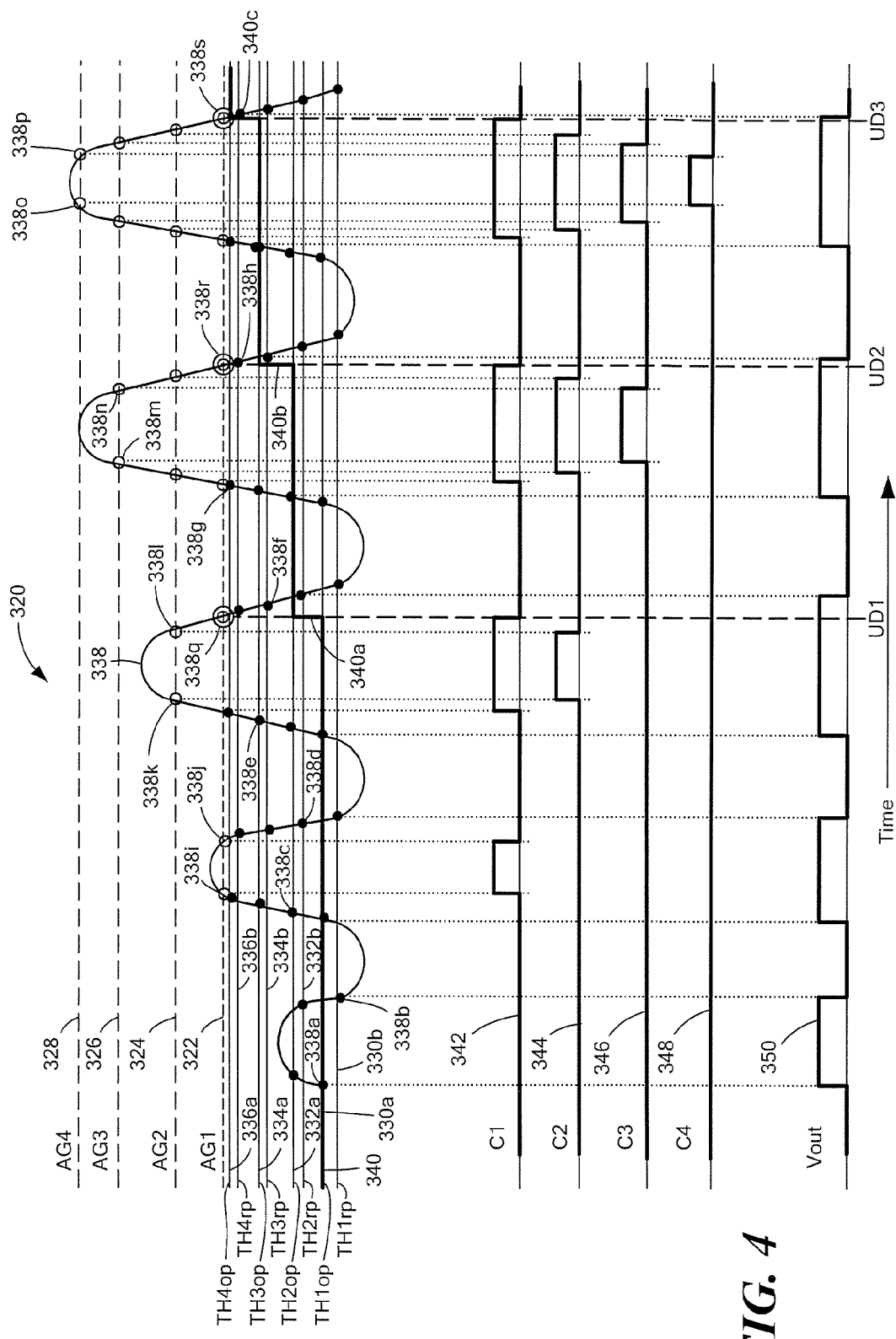
FIG. 4 is a graph showing a magnetic field signal, four comparison signals, and a sensor output signal representative of operation of the magnetic field sensor of FIG. 3.

Referring now to FIG. 4, a graph 320 has a horizontal axis in arbitrary units of time and a vertical axis in arbitrary units of voltage. Thresholds 330a, 330b correspond to the voltage 202a of FIG. 3 modified by hysteresis associated with the comparator 212 of FIG. 3 so as to be divided into the two thresholds 330a, 330b referred to herein as an operating point threshold (TH1op) 330a and a release point threshold (TH1rp) 330b. Thresholds 332a, 332b correspond to the voltage 202b of FIG. 3 modified by hysteresis associated with the comparator 212 of FIG. 3 so as to be divided into the two thresholds 332a, 332b. Thresholds 334a, 334b correspond to the voltage 202c of FIG. 3 modified by hysteresis associated with the comparator 212 of FIG. 3 so as to be divided into the two thresholds 334a, 334b. Thresholds 336a, 336b correspond to the voltage 202d of FIG. 3 modified by hysteresis associated with the comparator 212 of FIG. 3 so as to be divided into the two thresholds 336a, 336b.

Threshold 322 corresponds to the voltage 214a of FIG. 3, threshold 324 corresponds to the voltage 214b of FIG. 3, threshold 326 corresponds to the voltage 214c of FIG. 3, and threshold 328 corresponds to the voltage 214d of FIG. 3. Hysteresis associated with the thresholds 322-328 is not shown for clarity.

A signal 338 is representative of changes of amplitude of the magnetic field signal 20a of FIG. 3, for example, during a start up of the magnetic field sensor 200 of FIG. 3, during a beginning of a rotation of the object 12 of FIG. 3 (e.g., which may result in a temporary change of air gap), upon changes of the air gap 16 between to object 12 and the magnetic field sensing element 18 of FIG. 1, or in different installations of the magnetic field sensor 200 of FIG. 3 having different initial air gap. As described above, it will also be recognized that changes in air gap can result from asymmetries associated with the object, e.g., the gear 12 of FIG. 1, resulting in changes of the air gap 16 of FIG. 1 depending upon rotational angle of the gear 12.

Points 338i, 338j are representative of times when the magnetic field signal 338 crosses the threshold 322, resulting in corresponding changes of state of the comparison signal 216a of FIG. 3. Points 338k, 338l are representative of times when the magnetic field signal 338 crosses the threshold 324, resulting in corresponding changes of state of the comparison signal 218a of FIG. 3. Points 338m, 338n are representative of times when the magnetic field signal 338 crosses the threshold 326, resulting in corresponding changes of state of the comparison signal 220a of FIG. 3. Points 338o, 338p are representative of times when the magnetic field signal 338 crosses the threshold 328, resulting in corresponding changes of state of the comparison signal 222a of FIG. 3.

Points 338a, 338b are representative of times when the magnetic field signal 338 crosses the operating point threshold 330a and the release point threshold 330b. Points 338c, 338d are representative of times when the magnetic field signal 338 crosses the operating point threshold 332a and the release point threshold 332b. Points 338e, 338f are representative of times when the magnetic field signal 338 crosses the operating point threshold 334a and the release point threshold 334b. Points 338g, 338h are representative of times when the magnetic field signal 338 crosses the operating point threshold 336a and the release point threshold 336b.

Point 338q is representative of a time when the magnetic field signal 338 has first crossed the threshold 324 and thereafter crosses the threshold 322, which is a point at which an update occurs to select a different one of the thresholds 202a-202d of FIG. 3, namely, the threshold 202b (i.e. 332a, 332b). Point 338r is representative of a time when the magnetic field signal 338 has first crossed the threshold 326 and thereafter crosses the threshold 322, which is another point at which an update occurs to select a different one of the thresholds 202a-202d of FIG. 3, namely, the threshold 202c (i.e., 334a, 334b). Point 338s is representative of a time when the magnetic field signal 338 has first crossed the threshold 328 and thereafter crosses the threshold 322, which, as described above, is another point at which an update occurs to select a different one of the thresholds 202a-202d of FIG. 3, namely, the threshold 202d (i.e., 336a, 336b).

A signal 342 is representative of the comparison signal 216a of FIG. 3 having changes of state corresponding to times when the magnetic field signal 338 crosses the threshold 322 (214a of FIG. 3). A signal 344 is representative of the comparison signal 218a of FIG. 3 having changes of state corresponding to times when the magnetic field signal 338 crosses the threshold 324 (214b of FIG. 3). A signal 346 is representative of the comparison signal 220a of FIG. 3 having changes of state corresponding to times when the magnetic field signal 338 crosses the threshold 326 (214c of FIG. 3). A signal 348 is representative of the comparison signal 222a of FIG. 3 having changes of state corresponding to times when the magnetic field signal 338 crosses the threshold 328 (214d of FIG. 3).

A signal 350 is representative of the sensor output signal 212a of FIG. 3. Referring to a dark line 340, it will be understood that, until a time UD1 (update #1), the sensor output signal 350 is determined according to a comparison between the thresholds 330a, 330b and the magnetic field signal 338. Between the time UD1 and a time UD2, the sensor output signal 350 is determined according to a comparison between the thresholds 332a, 332b and the magnetic field signal 338, which is represented by a transition 340a of the dark line 340. Between the time UD2 and a time UD3, the sensor output signal 350 is determined according to a comparison between the thresholds 334a, 334b and the magnetic field signal 338, which is represented by another transition 340b of the dark line 340. After the time UD3, the sensor output signal 350 is determined according to a comparison between the thresholds 336a, 336b and the magnetic field signal 338, which is represented by another transition 340c of the dark line 340.

From the discussion above, it will be apparent that the effective operating point and release point thresholds against which the magnetic field signal 338 is compared to achieve the sensor output signal 350 are threshold 330a, 330b until the time UD1, thresholds 332a, 332b between the times UD1 and UD2, thresholds 334a, 334b between times UD2 and UD3, and thresholds 336a, 336b after the time UD3. Therefore, the effective threshold remains more centered in the amplitude range of the magnetic field signal 338 as the magnetic field signal 338 changes amplitude than would be achieved by an arrangement having only one fixed threshold. This results in better edge timing accuracy in the sensor output signal 350, and less likelihood of missed edges.

Figure 4A:
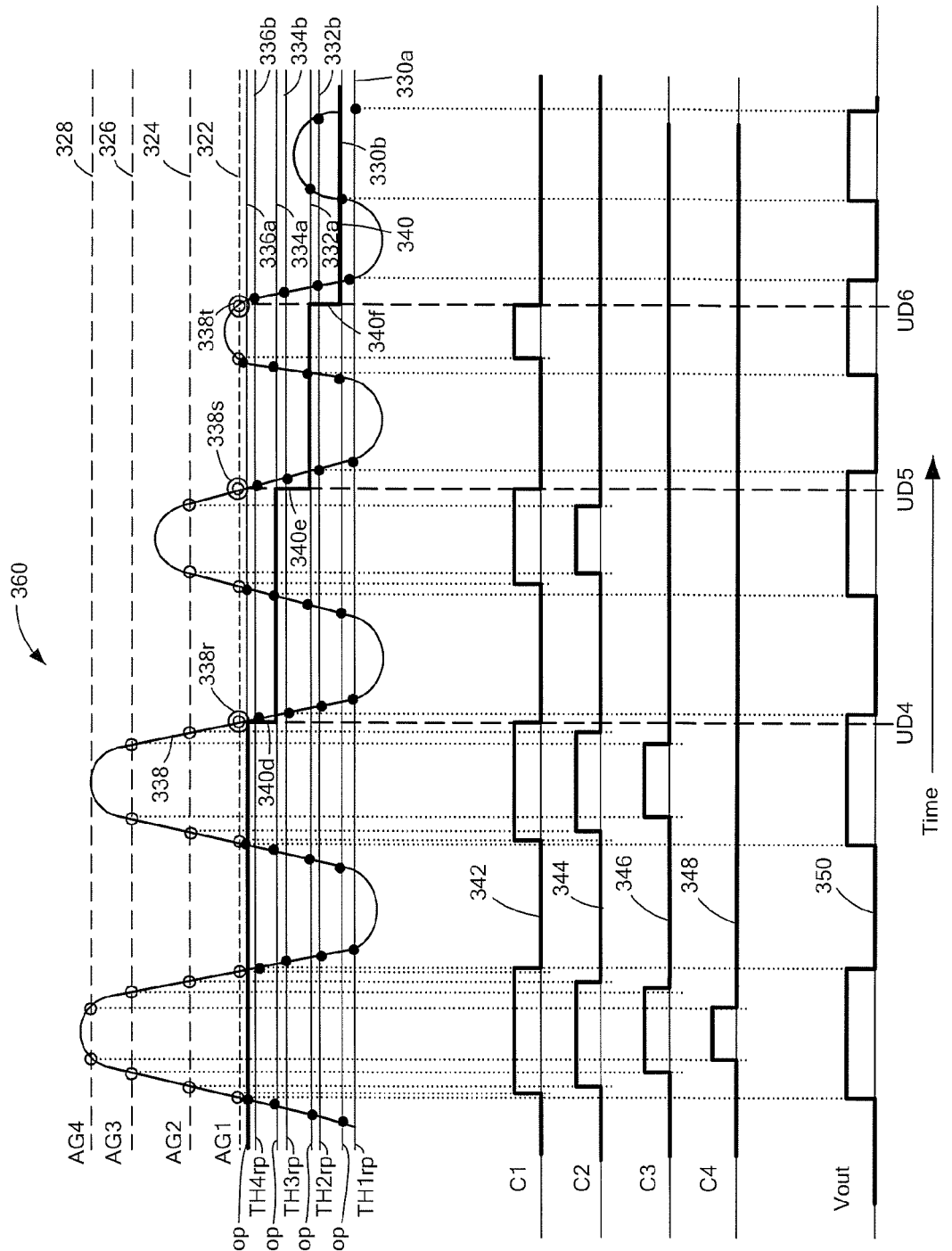
FIG. 4A is a graph showing a magnetic field signal, four comparison signals, and a sensor output signal representative of further operation of the magnetic field sensor of FIG. 3.

Referring now to FIG. 4A, in which like elements of FIG. 4 are shown having like reference designations, a graph 360 has a horizontal axis in arbitrary units of time and a vertical axis in arbitrary units of voltage. Unlike the graph 320 of FIG. 4, the signal 338 is shown decreasing in amplitude.

As described in conjunction with FIG. 4, the signal 350 is representative of the sensor output signal 212a of FIG. 3. It will be understood that, until a time UD4, the sensor output signal 350 is determined according to a comparison between the thresholds 336a, 336b and the magnetic field signal 338. Between the time UD4 and a time UD5, the sensor output signal 350 is determined according to a comparison between the thresholds 334a, 334b and the magnetic field signal 338, which is represented by a transition 340d of the dark line 340. Between the time UD5 and a time UD6, the sensor output signal 350 is determined according to a comparison between the thresholds 332a, 332b and the magnetic field signal 338, which is represented by a transition 340e of the dark line 340. After the time UD6, the sensor output signal 350 is determined according to a comparison between the thresholds 330a, 330b and the magnetic field signal 338, which is represented by a transition 340f of the dark line 340.

From the discussion above, it will be apparent that the effective operating point and release point thresholds against which the magnetic field signal 338 is compared to achieve the sensor output signal 350 are thresholds 336a, 336b until the time UD4, thresholds 334a, 334b between the times UD4 and UD5, thresholds 332a, 332b between the times UD5 and UD6, and the thresholds 330a, 330b after the time UD6. Therefore, the effective threshold remains more centered in the amplitude range of the magnetic field signal 338 as the magnetic field signal 338 changes amplitude than would be achieved by an arrangement having only one fixed threshold. This results in better edge timing accuracy in the sensor output signal 350, and less likelihood of missed edges.

Figure 5:
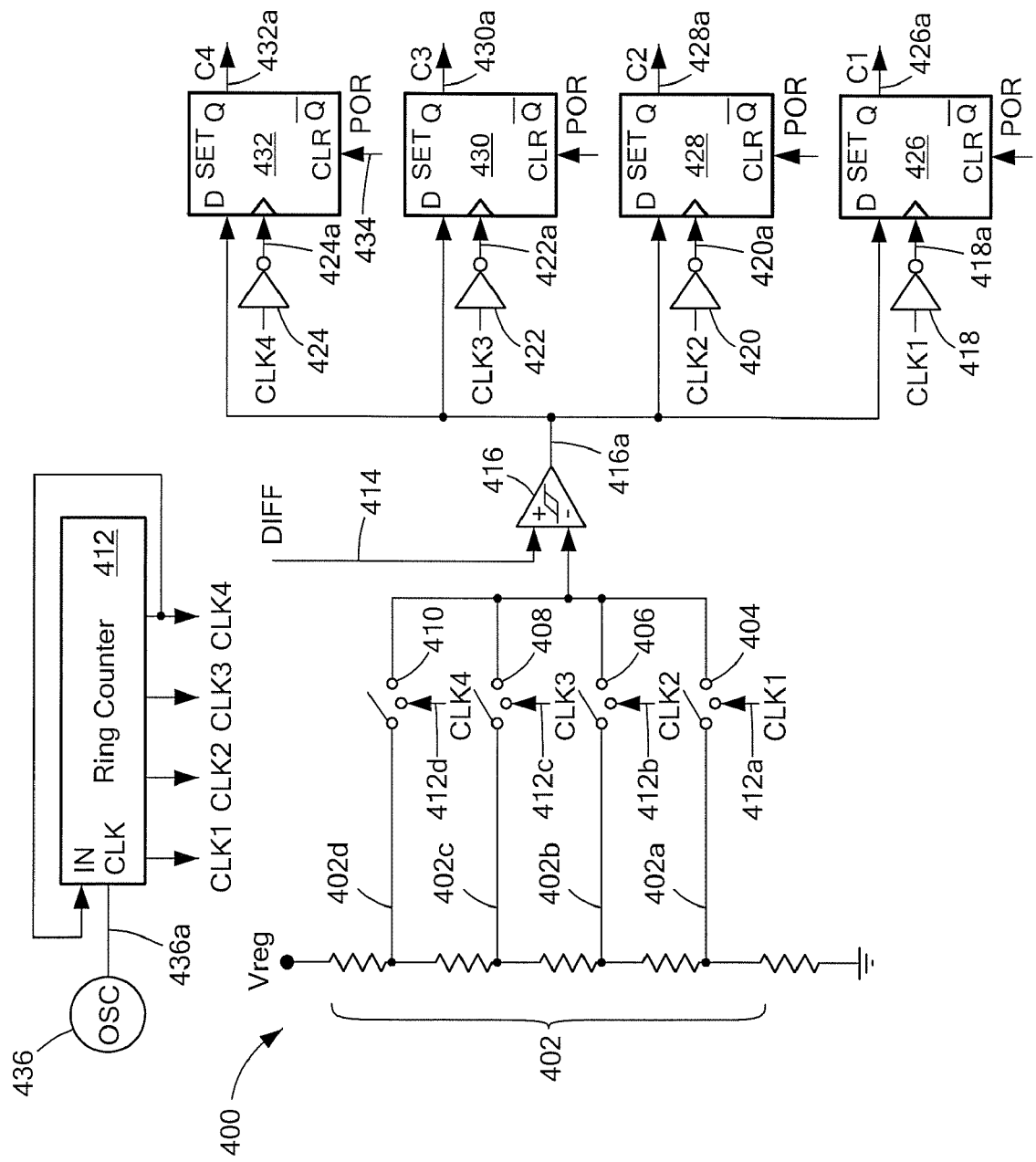
FIG. 5 is a block diagram of an alternative exemplary circuit that can be used to generate the comparison signals of FIGS. 1 and 3.

Referring now to FIG. 5, a circuit 400 can be used in place of the voltage generating circuits 22, 214 and the associated comparators 24-30 and 216-222 of FIGS. 1 and 3, respectively, in order to generate the comparison signals 24a-30a or 216a-222a of FIGS. 1 and 3, respectively.

The circuit 400 can include a threshold generating circuit 402, here a voltage generating circuit 402, configured to generate a plurality of different threshold signals 402a-402d, here a plurality of different voltages 402a-402d. The circuit 400 can also include a plurality of switches 404, 406, 408, 410, each switch coupled to receive a respective one of the plurality of voltages 402a-402d at a respective input node. The switches can be controlled to open or close by a counter 412, for example, a ring counter 412, configured to generate a plurality of control signals 412a-412d. The control signals 412a-412d can be sequentially and periodically active, with no two control signals 412a-412d active at the same time, thus, no two of the switches 404, 406, 408, 410 are controlled to close at the same time. In operation, the switches 404, 406, 408, 410 close sequentially and periodically. Output nodes of the switches 404, 406, 408, 410 can be coupled together forming a junction signal 434. An oscillator 436 can be configured to generate a clock signal 436a coupled to clock the ring counter 412.

The circuit 400 can also include a multiplexed comparator 416 coupled to receive the junction signal 434 and also coupled to receive a magnetic field signal 414, which can be the same as or similar to the magnetic field signal 20a of FIG. 1 or 3. The multiplexed comparator 416 is configured to generate a multiplexed comparison signal 416a.

The circuit 400 can include a plurality of D-type flip flops 426, 428, 430, 432, each coupled to receive the multiplexed comparison signal 416a at a respective D input. The flip-flops 426, 428, 430, 432 can be coupled to receive respective clock signals 418a, 420a, 422a, 424a at respective clock inputs. In some embodiments the clock signals 418a, 420a, 422a, 424a are inverted versions of the control signals 412a, 412b, 412c, 412d, inverted by inverters 418, 420, 422, 424, respectively. The inversion is provided in some embodiments merely to provide a delay from the closing of one of the switches, for example the switch 404, to the time that the associated flip flop, for example the flip flop 426, is clocked. The delay allows the multiplexed comparator 416 to settle.

Outputs 426a, 428a, 430a, 432a of the flip-flops 426, 428, 430, 432, respectively, are equivalent to the comparison signals 24a, 26, 28a, 30a, of FIG. 1 or the comparison signals 216a, 218a, 220a, 222a of FIG. 3, and operate accordingly.

Figure 6:
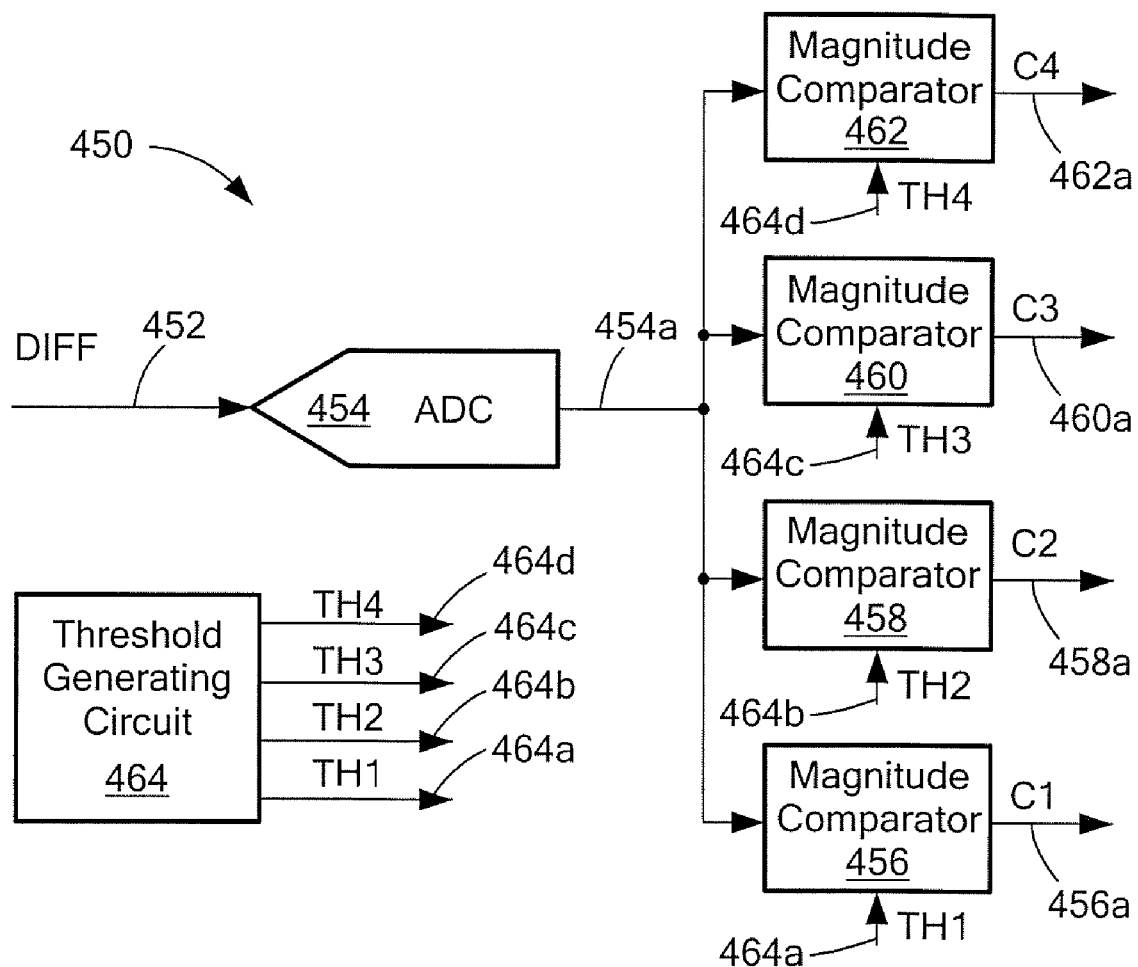
FIG. 6 is a block diagram of another alternative exemplary circuit that can be used to generate the comparison signals of FIGS. 1 and 3.

Referring now to FIG. 6, a circuit 450 can also be used in place of the voltage generating circuits 22, 214 and the associated comparators 24-30 and 216-222 of FIGS. 1 and 3, respectively, in order to generate the comparison signals 24a-30a or 216a-222a of FIGS. 1 and 3, respectively.

The circuit 450 can include an analog-to-digital converter (ADC) 454 coupled to receive a magnetic field signal 452, which can be the same as or similar to the magnetic field signal 20a of FIGS. 1 and 3. The ADC 454 is configured to generate a digitized magnetic field signal 454a, using any number of bits, for example, eight bits. However, in other embodiments an ADC that generates more than eight bits or fewer than eight bits can also be used.

The circuit 450 can also include a threshold generating circuit 464 configured to generate a plurality of different threshold signals 464a-464d, here a plurality of different digital threshold signals 464a-464d, which can each have a respective different static digital value.

The circuit 450 can also include a plurality of digital magnitude comparators 456, 458, 460, 462, each coupled to receive the digitized magnetic field signal 454a. The digital magnitude comparators 456, 458, 460, 462 are also each coupled to receive a different respective one of the plurality of different threshold signals 464a-464d. It should be understood that the digital threshold signals 464a-464d are comparable to the threshold signals 22a-22d of FIG. 1 and the signals 214a-214d of FIG. 3.

The digital magnitude comparators 456, 458, 460, 462 are configured to compare the digitized magnetic field signal 454a to the digital threshold signals 464a-464d and to generate comparison signals 456a, 458a, 460a, 462a, respectively. The comparison signals 456a, 458a, 460a, 462a are equivalent to the comparison signals 24a, 26, 28a, 30a, of FIG. 1 or the comparison signals 216a, 218a, 220a, 222a of FIG. 3 and operate accordingly.

With the above-described circuits and methods, a relatively simple, yet accurate magnetic field sensor is provided. Accuracy is achieved by comparing the magnetic field signal to various threshold signals determined in accordance with a general magnitude of the magnetic field signal, which determination is provided in the form of the comparison signals, and then to generate the sensor output signal based on the comparison signals. In this way, while not as complex as using a peak detector, the described circuits and methods achieve an effective switching threshold level that approximates a percentage of the peak-to-peak magnetic field signal as is desirable for switching accuracy.

While four threshold signals and four comparison signals are shown in the embodiments described above, it will be recognized that in other embodiments, there can be more than four or fewer than four threshold signals and more than four or fewer than four comparison signals.

While certain logic circuits are shown in FIGS. 1A and 3A, it will be appreciated that a variety of other logic circuits can be used to achieve the same results. In some other embodiments, the logic circuits of FIGS. 1A and 3A can be replaced with programmable devices, for example, microcontrollers having computer readable code therein.

Also, while certain timing is described above for making updates to the selection of comparison signals to provide as the sensor output signal 32a in FIG. 1, and which thresholds to compare to the magnetic field signal to generate the sensor output signal 212a of FIG. 3, it will be appreciated that other timing for update decisions can be used.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A magnetic field sensor, comprising:
a magnetic field sensing element configured to provide a magnetic field signal representative of a magnetic field experienced by the magnetic field sensing element;
a threshold generating circuit configured to generate a plurality of different threshold signals;
at least one comparator coupled to receive at least one of the plurality of different threshold signals at a first input node, and the at least one comparator coupled to receive the magnetic field signal at a second input node, wherein the at least one comparator is configured to generate a plurality of comparison signals indicative of the magnetic field signal having an amplitude above or below respective ones of the plurality of different threshold signals, and wherein a sensor output signal is generated by and output from the magnetic field sensor based on the plurality of comparison signals; and
a logic circuit coupled to receive the plurality of comparison signals, configured to adaptively select one of the plurality of comparison signals, configured to provide the selected one of the plurality of comparison signals as the sensor output signal, configured to adaptively select another different one of the plurality of comparison signals in response to a change of amplitude of the magnetic field signal, and configured to provide the selected another different one of the plurality of comparison signals as the sensor output signal in response to the change of the amplitude of the magnetic field signal.

2. The magnetic field sensor of claim 1, wherein the adaptively selected one of the plurality of comparison signals is selected in response to an amplitude of the magnetic field signal relative to the plurality of different threshold signals.

3. The magnetic field sensor of claim 1, wherein the threshold generating circuit comprises a resistor ladder and the plurality of different threshold signals comprises a plurality of different voltages.

4. The magnetic field sensor of claim 1, wherein the plurality of different threshold signals is comprised of linearly spaced threshold signals.

5. The magnetic field sensor of claim 1, wherein the plurality of different threshold signals is comprised of nonlinearly spaced threshold signals.

6. The magnetic field sensor of claim 1, wherein the magnetic field sensing element comprises a Hall effect element.

7. The magnetic field sensor of claim 1, wherein the magnetic field sensing element comprises a magnetoresistance element.

8. The magnetic field sensor of claim 1, wherein the plurality of different threshold signals comprises a plurality of digital threshold signals, each having a respective plurality of digital bits, and the at least one comparator is a digital comparator configured to receive at least one of the plurality of digital threshold signals.

9. The magnetic field sensor of claim 1, wherein a plurality of switches is coupled between the threshold generating circuit and the at least one comparator, and wherein the at least one comparator is a multiplexed comparator.

10. A method of providing a magnetic field sensor outputting a sensor output signal indicative of a movement of an object, comprising:
generating a magnetic field signal with a magnetic field sensing element, wherein the magnetic field signal is representative of a changing magnetic field resulting from the movement of the object;
generating a plurality of different threshold signals;
comparing the magnetic field signal to the plurality of different threshold signals to provide a corresponding plurality of comparison signals;
generating the sensor output signal from the magnetic field sensor based on the plurality of comparison signals; and selecting one of the plurality of comparison signals, wherein the generating the sensor output signal comprises:
providing the selected one of the plurality of comparison signals as the sensor output signal;
selecting another different one of the plurality of comparison signals in response to a change of amplitude of the magnetic field signal, and
providing the another different one of the plurality of comparison signals as the sensor output signal in response to the change of the amplitude of the magnetic field signal.

11. The method of claim 10, wherein the selected one of the plurality of comparison signals is selected in response to an amplitude of the magnetic field signal relative to the plurality of different threshold signals.

12. The method of claim 10, wherein the plurality of different threshold signals is comprised of linearly spaced threshold signals.

13. The method of claim 10, wherein the plurality of different threshold signals is comprised of nonlinearly spaced threshold signals.

14. The method of claim 10, wherein the magnetic field sensing element comprises a Hall effect element.

15. The method of claim 10, wherein the magnetic field sensing element comprises a magnetoresistance element.

16. The method of claim 10, wherein the plurality of different threshold signals comprises a plurality of digital threshold signals, each having a respective plurality of digital bits.

17. A magnetic field sensor, comprising:
a magnetic field sensing element configured to provide a magnetic field signal representative of a magnetic field experienced by the magnetic field sensing element;
a first threshold generating circuit configured to generate a first plurality of different threshold signals;
at least one comparator coupled to receive at least one of the first plurality of different threshold signals at a first input node, and the at least one comparator coupled to receive the magnetic field signal at a second input node, wherein the at least one comparator is configured to generate a plurality of comparison signals indicative of the magnetic field signal having an amplitude above or below respective ones of the first plurality of different threshold signals, and wherein a sensor output signal is generated by the magnetic field sensor based on the plurality of comparison signals;
a logic circuit coupled to receive the plurality of comparison signals and configured to generate a plurality of control signals having respective states related to transitions of the plurality of comparison signals;
a plurality of switches, each one of the plurality of switches having a respective control node coupled to receive a respective one of the plurality of control signals, wherein the plurality of control signals is configured to close at least a selected one of the plurality of switches in response to an amplitude of the magnetic field signal relative to the first plurality of different threshold signals; and
a second threshold generating circuit configured to generate a second plurality of different threshold signals, wherein each one of the plurality of switches is coupled to receive a different respective one of the second plurality of different threshold signals at a respective input node, wherein each one of the plurality of switches has a respective output node, wherein the output nodes are coupled together at a junction node.

18. The magnetic field sensor of claim 17, wherein the first threshold generating circuit comprises a first resistor ladder, the second threshold generating circuit comprises a second resistor ladder, the first plurality of different threshold signals comprises a first plurality of different voltages, and the second plurality of different threshold signals comprises a second plurality of different voltages.

19. The magnetic field sensor of claim 17, wherein at least one of the first or the second plurality of different threshold signals is comprised of respective first or second linearly spaced threshold signals.

20. The magnetic field sensor of claim 17, wherein at least one of the first or the second plurality of different threshold signals is comprised of respective first or second nonlinearly spaced threshold signals.

21. The magnetic field sensor of claim 17, further comprising an output comparator having a first input node coupled to the junction node and having a second input node coupled to receive the magnetic field signal, wherein the output comparator is configured to generate the sensor output signal.

22. A method of providing a magnetic field sensor having a sensor output signal indicative of a movement of an object, comprising:
generating a magnetic field signal with a magnetic field sensing element, wherein the magnetic field signal is representative of a changing magnetic field resulting from the movement of the object;
generating a first plurality of different threshold signals;
comparing the magnetic field signal to the first plurality of different threshold signals to provide a corresponding plurality of comparison signals;
generating the sensor output signal from the magnetic field sensor based on the plurality of comparison signals
generating a plurality of control signals having respective states related to transitions of the plurality of comparison signals
controlling a respective plurality of switches with the plurality of control signals, wherein the plurality of control signals is configured to close at least a selected one of the plurality of switches in response to an amplitude of the magnetic field signal relative to the first plurality of different threshold signals; and
generating a second plurality of different threshold signals, wherein each one of the plurality of switches is coupled to receive a different respective one of the second plurality of different threshold signals at a respective input node, wherein each one of the plurality of switches has a respective output node, wherein the output nodes are coupled together at a junction node.

23. The method of claim 22, wherein at least one of the first or the second plurality of different threshold signals is comprised of respective first or second linearly spaced threshold signals.

24. The method of claim 22, wherein at least one of the first or the second plurality of different threshold signals is comprised of respective first or second nonlinearly spaced threshold signals.

25. The method of claim 22, further comprising comparing a voltage at the junction node to the magnetic field signal to generate the sensor output signal.

* * * * *

UNITED STATES PATENT AND TRADEMARK OFFICE
CERTIFICATE OF CORRECTION

PATENT NO. : 8,058,864 B2
APPLICATION NO. : 12/425528
DATED : November 15, 2011
INVENTOR(S) : P. Karl Scheller et al.

Page 1 of 2

It is certified that error appears in the above-identified patent and that said Letters Patent is hereby corrected as shown below:

Front Page (75), delete "Inventors: Andreas P. Friedrich, Metz-Tessy (DE);" and replace with --Andreas P. Friedrich, Metz-Tessy (FR);--.

Column 2, Line 52, delete "tip," and replace with --up,--.

Column 4, Line 1, delete "is" and replace with --is a--.

Column 4, Line 2, delete "of" and replace with --of a--.

Column 4, Line 18, delete "of" and replace with --of a--.

Column 5, Line 35, delete "and" and replace with --an--.

Column 6, Line 33, delete "couple" and replace with --coupled--.

Column 7, Line 54, delete "to" and replace with --the--.

Column 9, Line 29, delete "threshold" and replace with --thresholds--.

Column 11, Line 35, delete "signals 272a" and replace with --signal 272a--.

Column 12, Line 18, delete "to" and replace with --the--.

Column 13, Line 33, delete "threshold" and replace with --thresholds--.

Column 14, Line 4, delete ", and the thresholds" and replace with --, and thresholds--.

Column 14, Line 38, delete "FIG." and replace with --FIGS.--.

Signed and Sealed this
Third Day of July, 2012

David J. Kappos
*Director of the United States Patent and Trademark Office*

CERTIFICATE OF CORRECTION (continued)
U.S. Pat. No. 8,058,864 B2

Column 14, Line 56, delete ",26," and replace with --,26a,--.

Column 18, Line 35, delete "signals" and replace with --signals;--.

Column 18, Line 38, delete "signals" and replace with --signals;--.